(12) United States Patent
Yamamoto (10) Patent No.: US 6,710,407 B2
(45) Date of Patent: Mar. 23, 2004

(54) SEMICONDUCTOR DEVICE HAVING SMOOTH REFRACTORY METAL SILICIDE LAYERS AND PROCESS FOR FABRICATION THEREOF

(75) Inventor: Ichiro Yamamoto, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/229,144

(22) Filed: Aug. 28, 2002

(65) Prior Publication Data

US 2003/0049919 A1 Mar. 13, 2003

(30) Foreign Application Priority Data

Sep. 13, 2001  (JP) ........................................ 2001-277603

(51) Int. Cl.$^7$ ............................................... H01L 29/06
(52) U.S. Cl. ........................... 257/344; 257/19; 257/336
(58) Field of Search ................................ 257/344, 336, 257/19, 15, 16, 17, 369, 392, 616

(56) References Cited

U.S. PATENT DOCUMENTS

| | | | | |
|---|---|---|---|---|
| 6,165,826 A | * | 12/2000 | Chau et al. | ............. 257/E21.64 |
| 6,326,664 B1 | * | 12/2001 | Chau et al. | ................. 257/344 |
| 6,432,763 B1 | * | 8/2002 | Yu | ............................... 257/412 |
| 6,436,773 B1 | * | 8/2002 | Yu | ............................... 438/284 |
| 6,518,106 B2 | * | 2/2003 | Ngai et al. | .................... 257/331 |
| 6,518,155 B1 | * | 2/2003 | Chau et al. | .......... 257/E21.171 |
| 6,559,469 B1 | * | 5/2003 | Paz de Araujo et al. | ...... 257/15 |
| 6,589,827 B2 | * | 7/2003 | Kubo et al. | .......... 257/E21.201 |
| 6,600,212 B2 | * | 7/2003 | Takayanagi et al. | ........ 257/616 |

FOREIGN PATENT DOCUMENTS

JP        2000-150669        5/2000

* cited by examiner

Primary Examiner—John F Niebling
Assistant Examiner—Walter L. Lindsay, Jr.
(74) Attorney, Agent, or Firm—Young & Thompson (57) ABSTRACT

A p-channel type field effect transistor incorporated in a semiconductor device has a gate electrode on a gate insulating layer, and the gate electrode is constituted by an amorphous silicon layer on the gate insulating layer, a silicon-germanium layer on the amorphous silicon layer, a polysilicon layer on the silicon germanium layer, a barrier layer of silicon oxide on the polysilicon layer residue of a cap silicon layer on the barrier layer and a cobalt silicide layer on the residue; while heat is being applied, boron, which has been ion implanted into the polysilicon layer and active region on both sides of the gate electrode, is activated with the assistance of germanium, and the barrier layer blocks the boundary between the cap silicon layer and the cobalt layer from the germanium so that the cobalt silicide forms a continuous layer without any coagulation.

13 Claims, 10 Drawing Sheets

SEMICONDUCTOR DEVICE HAVING SMOOTH REFRACTORY METAL SILICIDE LAYERS AND PROCESS FOR FABRICATION THEREOF

FIELD OF THE INVENTION

This invention relates to the structure of a filed effect transistor and, more particularly, to a semiconductor device having a field effect transistor with a multi-layered gate electrode formed from a silicon-germanium layer, a polysilicon layer and a refractory metal silicide layer.

DESCRIPTION OF THE RELATED ART

Various sorts of integrated circuits are fabricated on semiconductor substrates, and p-channel type field effect transistors and n-channel type field effect transistors are major circuit components of the integrated circuits. The p-channel type field effect transistors and n-channel type field effect transistors have been scaled down for enhancing the integration density of the circuit components. This results in the miniature electrode and extremely thin gate insulating layer. However, when the gate electrode is miniaturized, the short channel effect tends to occur in the field effect transistor due to the narrow gate width.

A countermeasure against the short channel effect is introduction of dopant impurity, which is opposite to the channel conductivity, into the gate electrode. Boron is, by way of example, introduced into the polysilicon gate electrodes of the p-channel type field effect transistors, and arsenic or phosphorous is introduced into the polysilicon gate electrodes of the n-channel type field effect transistors.

The opposite dopant impurity is introduced as follows. First, insulating material is grown on the major surface of the silicon substrate, and polysilicon is further grown on the insulating layer. The insulating layer serves as the gate insulating layers of the field effect transistors, and the polysilicon layer is patterned into polysilicon strips for the gate electrodes. P-type dopant impurity is concurrently ion implanted into surface portions of the silicon substrate and the polysilicon strips in the self-aligned manner so that the p-type doped polysilicon strips are obtained together with the p-type doped silicon regions. Furthermore, n-type dopant impurity is concurrently ion implanted into other surface portions of the silicon substrate and the remaining polysilicon strips in the self-aligned manner so that the n-type doped polysilicon strips are obtained together with the n-type doped silicon regions.

After the ion-implantation, the p-type doped silicon regions, p-type doped polysilicon strips, n-type doped silicon regions and n-type doped polysilicon strips are subjected to a heat treatment. While the thermal energy is being applied to the silicon substrate, the p-type dopant impurity and n-type dopant impurity are activated, and p-type source/drain regions, p-type gate electrodes, n-type source/drain regions and n-type gate electrodes are produced from the p-type doped silicon regions, p-type doped polysilicon strips, n-type doped silicon regions and n-type doped polysilicon strips, respectively.

However, a problem is encountered in the prior art semiconductor device in that the p-channel type field effect transistors exhibit transistor characteristics not so high as those expected. This is because of the fact that the amount of thermal energy to be required for activation of dopant impurity is different between the born and the arsenic/phosphorous.

The manufacturer is assumed to adjust the heat treatment to a time period proper to activate the arsenic or phosphorous. Although the thermal energy is much enough to activate the arsenic or phosphorous, the thermal energy is too little to activate the boron, and leaves a substantial amount of boron inactive. The inactive boron is left at the boundary between the gate insulating layer and the gate electrode. When the gate electrode is biased, a depletion layer extends from the boundary into the gate electrode, and the depletion layer makes the threshold varied.

On the other hand, if the manufacturer adjusts the heat treatment to a time period long enough to active the boron, the thermal energy is much enough to activate the boron as well as the arsenic/phosphorous. However, the arsenic/phosphorous are diffused over target profiles of the source/drain regions.

Figure 1A:
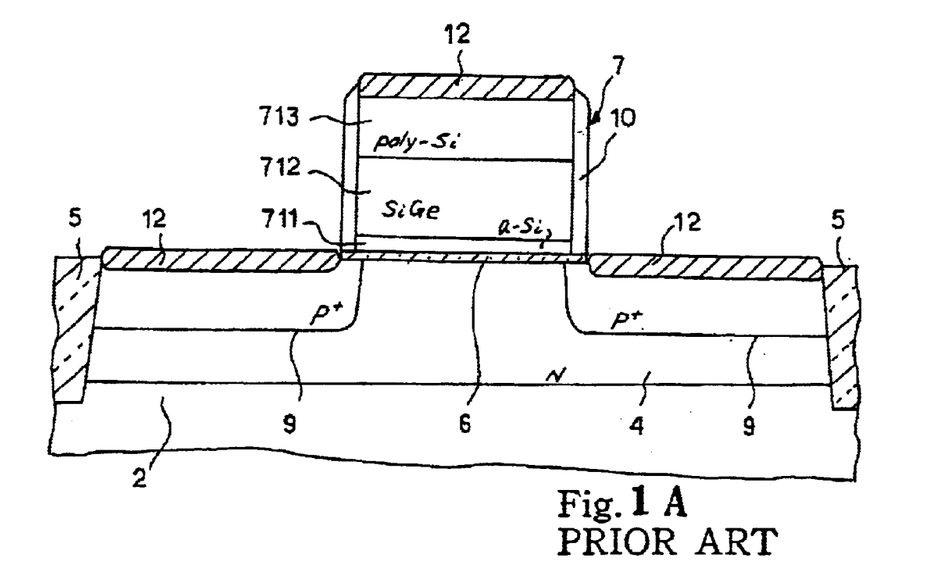
FIG. 1A is a cross sectional view showing the structure of the prior art field effect transistor disclosed in the Japanese Patent Application laid-open.

Thus, there is a trade-off in the activation between the boron and the arsenic/phosphorous. A countermeasure against the problem is disclosed in Japanese Patent Application laid-open No. 2000-150669. Introduction of germanium is taught in the Japanese Patent Application laid-open. The germanium enhances the activation of boron so that the gate electrode is prevented from the depletion layer. FIG. 1A shows the p-channel type field effect transistor. The prior art p-channel type field effect transistor is fabricated on a silicon substrate (not shown). An epitaxial layer is grown on the silicon substrate, and an n-type well 4 is formed in a surface portion of the epitaxial layer. An isolating region 5 is formed in the n-type well 4, and defines an active region assigned to the prior art p-channel type field effect transistor in the n-type well 4. A gate insulating layer 6 is grown on a surface portion of the active region, and a gate electrode 7 is fabricated on the gate insulating layer 6.

The gate electrode 7 has a multi-layered structure, and boron is doped in the multi-layered structure. The multi-layered structure consists of amorphous silicon layer 711 on the gate insulating layer 6, a silicon-germanium layer 712 laminated on the amorphous silicon layer 711, a polysilicon layer 713 laminated on the silicon-germanium layer 712 and a cobalt silicide layer 12 self-aligned with the polysilicon layer 713. Insulating side walls 10 are formed on the side surfaces of the multi-layered structure.

On both sides of the gate electrode 7 are formed heavily-doped p-type source/drain regions 9 which are overlaid with cobalt silicide layers 12 in a self-aligned manner. The heavily-doped p-type source/drain regions 9 are doped with boron.

The germanium in the silicon-germanium layer 712 enhances the activation of the boron doped in the silicon. The activated boron is so much at the boundary between the gate insulating layer and the multi-layered structure that the depletion layer is less developed. Thus, the germanium in the gate electrode 7 restricts the undesirable fluctuation of the threshold.

Another advantage is taught in the Japanese Patent Application laid-open. The silicon germanium layer decelerates the diffusion of boron so that the boron is less diffused into the channel region.

Figure 1B:
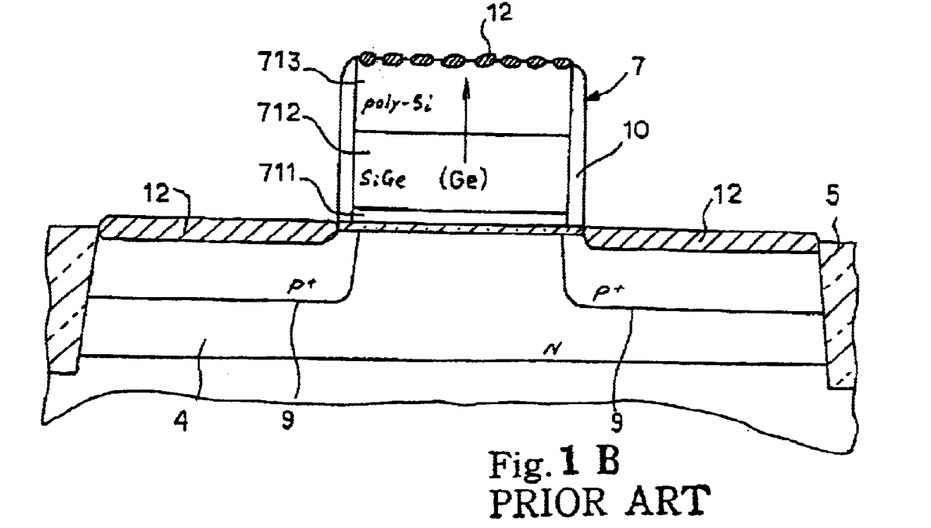
FIG. 1B is a cross sectional view showing the coagulation of cobalt silicide on the gate electrode of the prior art field effect transistor.

The present inventor confirmed the advantages of the prior art gate structure. The germanium surely enhanced the activation of the boron. Nevertheless, the present inventor noticed that the germanium was an obstacle against the silicidation. While the boron-implanted layers are being heated, the cobalt reacted with the silicon, and the cobalt silicide was grown on the polysilicon layer 713 and the source/drain regions 9 in the self-aligned manner. The germanium was diffused in the heat treatment, and reached the boundary between the polysilicon layer 713 and the cobalt layer. The germanium less reacted with the cobalt, and caused the cobalt silicide to be coagulated as shown in FIG. 1B. This means that the cobalt silicide layer was not continuously formed on the polysilicon layer 713. The manufacturer expected the cobalt silicide layer to reduce the resistance along the signal lines. However, the coagulated cobalt silicide caused the signal line to have large resistance. Thus, the germanium spoiled the self-aligned silicide, i. e., salicide structure.

The present inventor carried out experiments to see whether or not the coagulation occurred on other salicide structures. The present inventor fabricated the prior art p-channel type field effect transistors where the cobalt was replaced with titanium or nickel. The titanium silicide and nickel silicide were also coagulated on the gate electrodes.

SUMMARY OF THE INVENTION

It is therefore an important object of the present invention to provide a semiconductor device, a field effect transistor of which includes a germanium containing gate electrode having a refractory metal silicide layer free from the coagulation.

It is also an important object of the present invention to provide a process for fabricating the semiconductor device.

To accomplish the object, the present invention proposes to form a barrier layer under the refractory metal silicide layer.

In accordance with one aspect of the present invention, there is provided a semiconductor device having a field effect transistor, and the field effect transistor comprises a semiconductor layer including a source region, a drain region and a channel region between the source region and the drain region, a gate insulating layer formed on the channel region and a gate electrode formed on the gate insulating layer and including a germanium-containing conductive strip formed on the gate insulating layer and having a boundary region to the gate insulting layer headily doped with a dopant impurity, a silicon containing conductive strip formed on the germanium-containing conductive strip, heavily doped with the dopant impurity and including a barrier strip against a diffusion of the germanium contained in the germanium-containing conductive strip and a refractory metal silicide layer formed on the silicon containing conductive strip.

In accordance with another aspect of the present invention, there is provided a process for fabricating a semiconductor device, comprising the steps of a) preparing a semiconductor layer, b) forming a gate insulating layer on a part of the semiconductor layer, c) forming a multi-layered structure having a germanium containing conductive layer, a lower part of a silicon containing conductive layer, a barrier layer against a diffusion of germanium, an upper part of the silicon containing conductive layer and a refractory metal layer on a gate insulating layer, d) introducing a dopant impurity in at least a part of the multi-layered structure under the barrier layer, e) heating at least the multi-layered structure so as to diffuse the dopant impurity and the germanium to a boundary between the gate insulating layer and the germanium containing conductive layer for increasing the concentration of the dopant impurity in the boundary and to cause the refractory metal of the refractory metal layer to react with silicon in the upper part of the silicon containing conductive layer for producing a refractory metal silicide layer, the barrier layer preventing the reaction between the refractory metal and the silicon from the germanium diffused from the germanium containing conductive layer, and f) completing a field effect transistor having the multi-layered structure serving as a gate electrode.

BRIEF DESCRIPTION OF THE DRAWINGS

The features and advantages of the semiconductor device and process will be more clearly understood from the following description taken in conjunction with the accompanying drawings, in which.

DESCRIPTION OF THE PREFERRED EMBODIMENTS

Semiconductor Device

A semiconductor device embodying the present invention is fabricated on a semiconductor substrate. At least one p-channel type field effect transistor is incorporated in the semiconductor device. The p-channel type field effect transistor may form a part of an integrated circuit. In case where a complementary transistor is employed in the integrated circuit as a unit component, the p-channel type field effect transistor is connected in series to an n-channel type field effect transistor. Otherwise, the p-channel type field effect serves as a switching element in the integrated circuit.

The p-channel enhancement type field effect transistor is a bulk transistor or a thin film transistor. In either case, the p-channel type field effect transistor has a well known structure. There is a channel region between a p-type source region and a p-type drain region. The channel region is overlaid with an extremely thin gate insulating layer, and a gate electrode is fabricated on the gate insulating layer. The gate structure makes the p-channel type field effect transistor according to the present invention discriminative from the prior art p-channel type field effect transistors.

The gate electrode includes a germanium-containing conductive layer, a silicon-containing conductive layer and a refractory metal silicide layer, and a barrier layer forms a part of the silicon-containing conductive layer. Side wall spacers may be further incorporated in the gate electrode. The refractory metal silicide layer is self-aligned with the silicon-containing conductive layer, because the refractory metal reacted with the silicon in the silicon-containing conductive layer in a heat treatment of a fabrication process. The refractory metal silicide layer continuously extends on the silicon-containing conductive layer. In other words, the refractory metal silicide is never coagulated. The reason why the refractory metal silicide continuously extends is that the barrier layer prevented refractory metal from the germanium as will be described in conjunction with a fabrication process. The barrier layer permits current to flow therethrough so that the gate structure exhibits a low resistance in spite of the barrier layer.

The silicon-containing conductive layer is formed on the germanium-containing conductive layer. P-type dopant impurity, which enhances the conductivity of the gate structure, is introduced in a part of the silicon-containing conductive layer between the barrier layer and the germanium-containing conductive layer. The concentration of the p-type dopant impurity is so heavy that a boundary region in the vicinity of the gate insulating layer is less depleted under application of reverse bias to the gate structure. For this reason, the p-channel type field effect transistor exhibits target transistor characteristics.

As will be understood, a gate bias signal is smoothly propagated to the gate structure by virtue of the low resistance, and makes the p-channel type field effect transistor according to the present invention turn on and off at a target threshold. The target threshold does not fluctuate so that the p-channel type field effect transistor is highly reliable.

The silicon-containing conductive layer may be made of polysilicon or silicon crystallized from amorphous silicon except the barrier layer. A part of the silicon-containing conductive layer between the barrier layer and the refractory metal silicide layer may be made of the silicon crystallized from amorphous silicon in a heat treatment. In case where the polysilicon is used, it is preferable that the grain size is fallen within 20 nanometers to 50 nanometers, because the boron is diffused through the polysilicon with the grain size between 20 nanometers to 50 nanometers at high speed. The part of the silicon-containing conductive layer between the barrier layer and the refractory metal silicide layer is hereinbelow referred to as "conductive cap layer".

The p-type dopant impurity may be boron, and the germanium-containing conductive layer may have a thin silicon layer and a silicon-germanium layer made of silicon-germanium alloy. The thin silicon layer is made of silicon crystallized from amorphous silicon in the heat treatment or polysilicon. In case where the p-channel type field effect transistors and n-channel enhancement type field effect transistors are incorporated in the integrated circuit, it is preferable that the content of germanium is fallen within the range between 10% and 30%. The n-channel type field effect transistors are usually fabricated concurrently with the p-channel type field effect transistors, and the germanium-silicon alloy layer is patterned into the lower parts of both p-channel type and n-channel type field effect transistors. Even though the germanium-silicon strips are incorporated in the gate structures of the n-channel type field effect transistors, n-type dopant impurity was sufficiently activated in so far as the germanium content was fallen within the above range.

The barrier layer may be formed from an extremely thin silicon oxide layer, extremely thin silicon nitride layer or conductive titanium nitride layer. The barrier layer is so thin that current flows through the barrier layer. In order to permit the current to flow, it is preferable that the silicon oxide layer and silicon nitride layer are 0.5 nanometer to 1.5 nanometers thick. In case where the barrier layer is made of titanium nitride, it is preferable that the titanium nitride layer is 5 nanometers to 15 nanometers thick. The conductive cap layer may have the thickness between 20 nanometers and 50 nanometers.

Process

Description is hereinbelow made on a process for fabricating a semiconductor device according to the present invention with reference to FIGS. 2A to 2F. The process starts with preparation of a p-type silicon substrate 1. P-type silicon is epitaxially grown on the major surface of the p-type silicon substrate 1, and forms a p-type epitaxial layer 2.

Figure 2A:
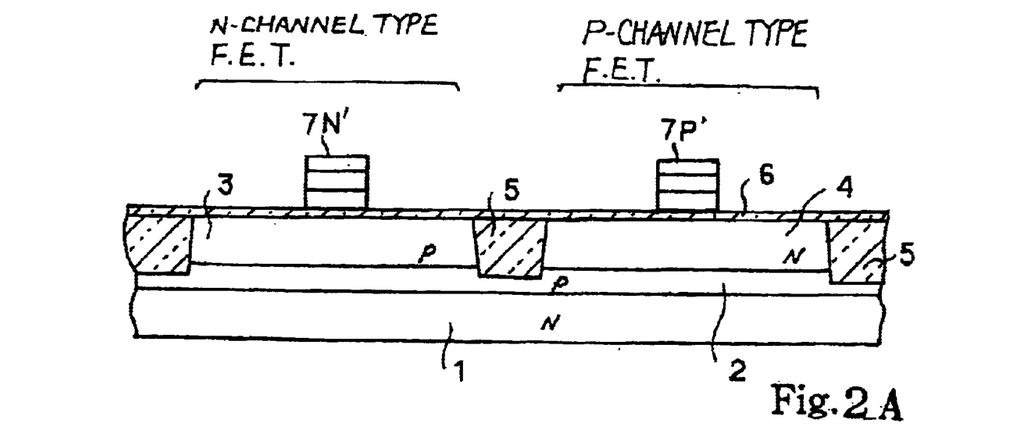
FIGS. 2A to 2F are cross sectional views showing a process for fabricating a semiconductor device according to the present invention.

P-type dopant impurity is ion implanted into a selected region of the p-type epitaxial layer 2, and a p-type well 3 is formed in the p-type epitaxial layer 2. N-type dopant impurity is ion implanted into another selected region of the p-type epitaxial layer 2, and an n-type well 4 is formed in the p-type epitaxial layer 2. An isolating region 5 is further formed in the p-type epitaxial layer 2, and active regions are defined by the isolating region 5. In this instance, the shallow trench isolation is used as the isolating region. One of the active regions is assigned to an n-channel type field effect transistor, and another active region is assigned to a p-channel type field effect transistor.

The active regions assigned to the field effect transistors are thermally oxidized. While the silicon is being thermally oxidized, silicon oxide, i.e., SiOx is grown to 10 nanometers thick, and the active regions are covered with a silicon oxide layer 6. The silicon oxide layer 6 serves as gate insulating layers of the n-channel type/p-channel type field effect transistors. Subsequently, gate structures 7N' and 7P' are fabricated on the gate insulating layers 6 as shown in FIG. 2A.

Figure 3A:
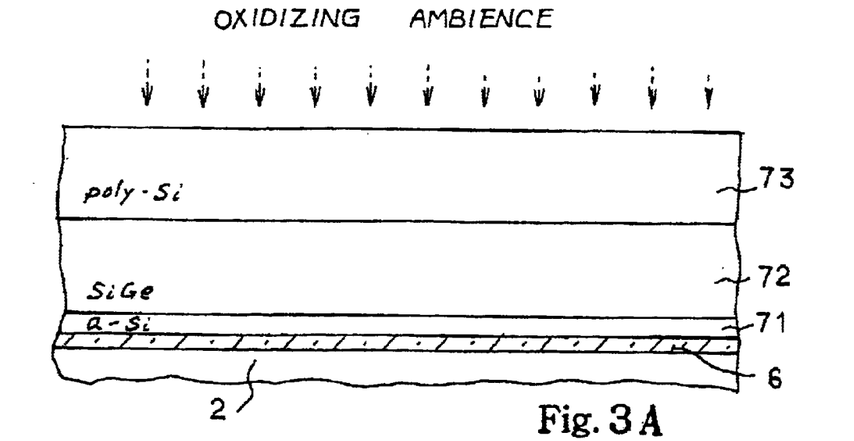
FIGS. 3A to 3C are cross sectional views showing steps for fabricating gate structures.
Figure 3B:
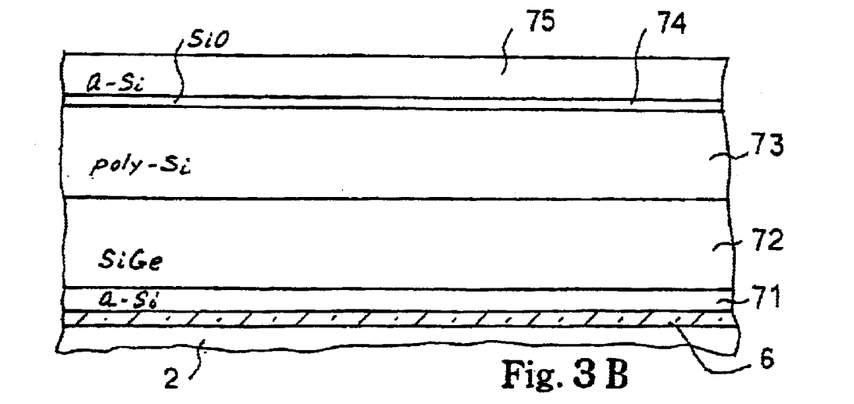
Figure 3C:
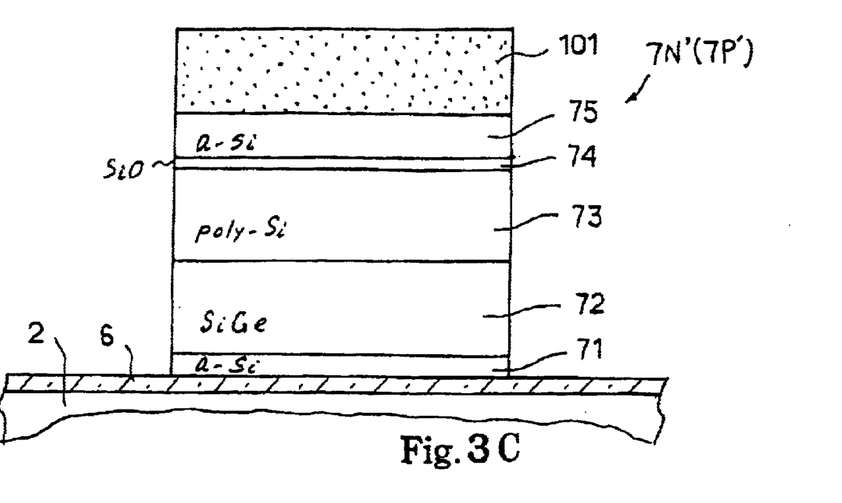

The fabrication of the gate structures 7N'/7P' are illustrated in FIGS. 3A to 3C in detail. First, amorphous silicon is deposited to 3 nanometers to 20 nanometers thick on the entire surface by using a chemical vapor deposition, and forms an amorphous silicon layer 71. Amorphous silicon is replaceable with polysilicon. If the polysilicon be used, the silicon oxide layer 6 will be overlaid with a polysilicon layer.

Subsequently, mixture of silicon and germanium is deposited to 20 nanometers to 100 nanometers thick on the amorphous silicon layer 71 by using a chemical vapor deposition, and forms a silicon-germanium layer 72. The mixing ratio between silicon and germanium, i.e., Si:Ge is fallen within the range of 70–80:20–30. Upon completion of the n-channel type field effect transistor and p-channel type field effect transistor, the germanium content is fallen within the rage between 10% and 30%. The silicon-germanium has good affinity with the amorphous silicon, and the silicon-germanium layer 72 is strongly adhered to the amorphous silicon layer 71. The silicon-germanium layer 72 uniformly extends over the amorphous silicon layer 71 without any coagulation. If the silicon-germanium layer be deposited directly over the silicon oxide layer 6, the silicon-germanium will be coagulated due to poor affinity between the silicon oxide and the silicon-germanium.

Subsequently, polysilicon is deposited to 50 nanometers to 100 nanometers thick over the silicon-germanium layer 72, and forms a polysilicon layer 73. The polysilicon layer 73 is exposed to oxidizing ambience as shown in FIG. 3A so as to form a silicon oxide layer of 0.5 nanometer to 1.5 nanometers thick. The extremely thin silicon oxide layer serves as a barrier layer 74 against the germanium.

One of three sorts of oxidizing ambience is available for the silicon oxide layer 74. The first oxidizing ambience is the atmosphere. When the chemical vapor deposition is completed, the resultant semiconductor structure is taken out from the deposition chamber to the atmosphere, and the polysilicon layer 73 is exposed to the atmosphere. Oxygen, which is contained in the atmosphere, reacts with the polysilicon, and the polysilicon layer 73 is covered with the extremely thin natural oxide, which serves as the barrier layer 74. The second oxidizing ambience is artificially created in the deposition chamber. When the chemical vapor deposition is completed, oxidizable gas is introduced into the deposition chamber for creating the oxidizing ambience. The oxidizable gas may contain oxygen gas, i.e. $O_2$ gas. The oxygen in the oxidizable gas reacts with the polysilicon, and an extremely thin silicon oxide layer is grown on the polysilicon layer 73. The extremely thin silicon oxide layer serves as the barrier layer 74. The third oxidizing ambience is cleaning solution. The cleaning solution may contain sulfuric acid and hydrogen peroxide. When the chemical vapor deposition of polysilicon is completed, the resultant semiconductor structure is taken out from the deposition chamber, and is cleaned in the cleaning solution, i.e., SPM cleaning. The polysilicon is oxidized in the cleaning solution, and is covered with an extremely thin silicon oxide layer, which serves as the barrier layer 74.

The present inventor evaluated the three sorts of oxidizing ambience. The silicon oxide grown in the first oxidizing ambience was the thinnest of all. The silicon oxide grown in the second oxidizing ambience was the thickest of all. The exposure to the third oxidizing ambience resulted in the silicon oxide layer between the silicon oxide layer grown in the first oxidizing ambience and the silicon oxide layer grown in the second oxidizing ambience.

When the polysilicon layer 73 is covered with the barrier layer 74, amorphous silicon is grown to 20 nanometers to 50 nanometers thick on the barrier layer 74 by using the chemical vapor deposition, and the amorphous silicon layer serves as a cap silicon layer 75. It is preferable to regulate the total thickness of the barrier layer 74 and cap silicon layer 75 to about 100 nanometers. The resultant gate structure is shown in FIG. 3B. In this instance, the amorphous silicon layer 71 and silicon-germanium layer 72 are corresponding to a germanium containing conductive layer, and the polysilicon layer 73, barrier layer 74 and cap silicon layer 75 as a whole constitute a silicon-containing conductive layer.

Photo-resist solution is spread over the entire surface of the cap silicon layer 75, and is baked so as to form a photo-resist layer. A pattern image for the gate structures 7N/7P and gate signal lines is transferred from a photo-mask to the photo-resist layer, and a latent image is produced in the photo-resist layer. The latent image is developed so that a photo-resist mask 101 is left on the cap silicon layer 75. Thus, the photo-resist mask 101 is formed through a photo lithography.

Using the photo-resist mask 101 as an etching mask, the cap silicon layer 75, barrier layer 74, polysilicon layer 73, silicon-germanium layer 72 and amorphous silicon layer 71 are successively etched, and are patterned into laminated structures 7N'/7P' of the amorphous silicon strips, silicon-germanium strips, silicon oxide strips and amorphous silicon strips and extensions thereof as shown in FIG. 3C. The photo-resist mask 101 is stripped off. Thus, the gate structures 7N'/7P' and extensions thereof are formed on the gate insulating layers 6 through the deposition, oxidation, photo lithography and etching. The extensions extend on the isolating region 5 in a perpendicular direction to the paper where FIGS. 3A to 3C are drawn, and gate signal lines 7A (see FIG. 4) are formed on the basis of the extensions as will be described hereinafter.

Figure 2B:
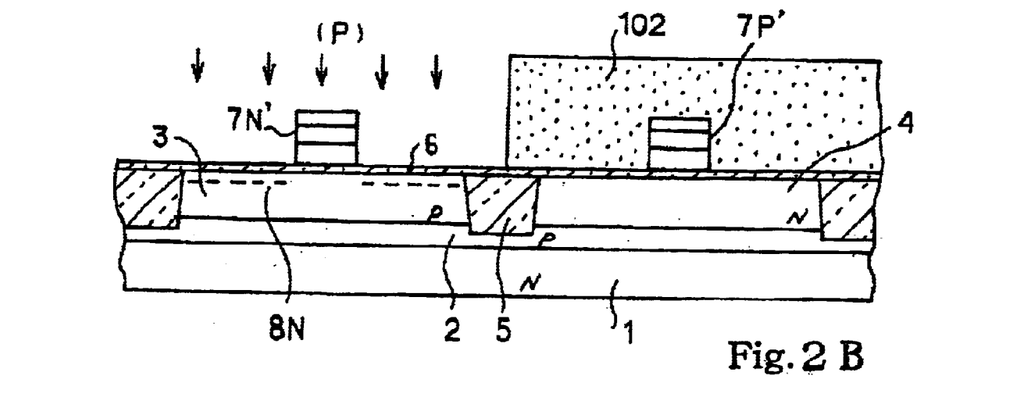

Turning back to FIGS. 2A to 2F, the gate structures 7N'/7P', from which the photo-resist mask 101 has been already stripped off, are corresponding to those shown in FIG. 2A. The active region assigned to the p-channel type field effect transistor and the gate structure 7P' are covered with a photo-resist mask 102. The photo-resist mask 102 is formed through the photolithography. The active region and, accordingly, the gate structure 7N' are uncovered with the photo-resist mask 102. Using the photo-resist mask 102 as an ion-implantation mask, n-type dopant such as, for example, phosphorous is ion implanted into the gate structure 7N' and the active region on both sides of the gate structure 7N' as shown in FIG. 2B. The acceleration energy is adjusted in such a manner that the phosphorous reaches the polysilicon strip 73. Thus, n-type doped regions 8N are produced in a self-aligned manner with the gate structure 7N'.

Figure 2C:
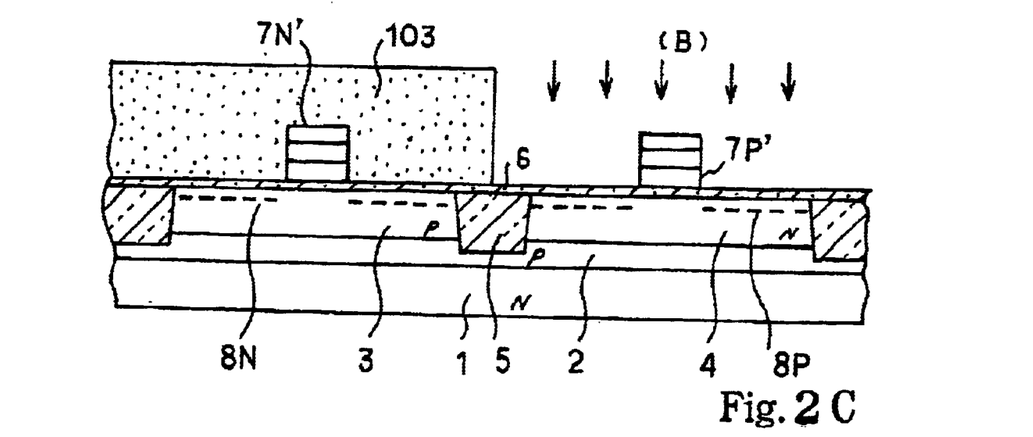

The photo-resist mask 102 is stripped off, and another photo-resist mask 103 is formed on the active region assigned to the n-channel type field effect transistor and gate structure 7N' through the photo lithography. The active region assigned to the p-channel type field effect transistor and gate structure 7P' are uncovered with the photo-resist mask 103. Using the photo-resist mask as an ion-implantation mask, p-type dopant impurity such as, for example, boron is ion implanted into the gate structure 7P' and the active region on both sides thereof in a self-aligned manner as shown in FIG. 2C. The acceleration energy is adjusted to a certain value at which the boron reaches the polysilicon strip 73. The gate structure 7P' is doped with the boron, and p-type doped regions 8P are produced on both sides of the gate structure 7P' in the self-aligned manner. The photo-resist mask 103 is stripped off.

When the process engineer determines the acceleration energy for the ion-implantation of boron, the followings are to be taken into account. If the boron concentration is peaked in the cap silicon strip 75, the boron hardly reaches the amorphous silicon strip 71, because the barrier strip 74 is the obstacle against the diffusion of the boron. On the other hand, if the boron is implanted deep in the polysilicon strip 73, the boron is also peaked deep in the active region on both sides of the gate structure 7P'. While the heat is being applied to the boron, the boron is further diffused into the active region, and the boron forms the p-n junction deep in the active region. This means that the p-channel type field effect transistor does not have the shallow source and drain regions. In order to fulfill these conditions, the process engineer adjusts the acceleration energy to a certain value at which the boron concentration is peaked beneath the barrier strip 74.

Subsequently, silicon oxide or silicon nitride is deposited over the entire surface of the resultant structure. The gate structures 7N'/7P' and extensions are conformably covered with the silicon oxide layer or silicon nitride layer. The silicon oxide layer or silicon nitride layer is isotropically etched without any etching mask. Side wall insulating spacers 10 are left on side walls of the gate structures 7N'/7P' and side walls of the extensions 7.

Figure 2D:
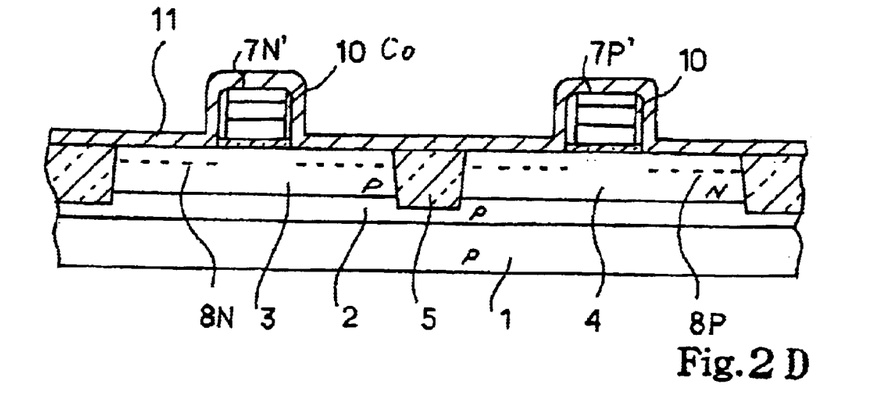

Subsequently, cobalt is deposited over the entire surface of the resultant semiconductor structure by using a sputtering, and forms a cobalt layer 11 conformably extending on the entire surface as shown in FIG. 2D. The cobalt layer 11 is held in contact with the phosphorous-doped regions 8N, amorphous silicon strips 75 of the gate structures 7N'/7P' and boron-doped regions 8P. However, the remaining portion of the cobalt layer 11 is held in contact with the silicon oxide such as the side wall insulating spacers 10 and isolating region 5.

The resultant semiconductor structure is subjected to a heat treatment. The ion-implanted boron and ion-implanted phosphorous are activated in the heat treatment, and the cobalt layer 11 is selectively silicided also in the heat treatment. The amorphous silicon strips 71 and 75 are crystallized during the heat treatment. However, the grain size is of the order of 100 nanometers. Although those strips 71 and 75 are still referred to as "amorphous silicon strips 71 and 75", the "amorphous" means silicon crystallized from the amorphous silicon.

While the thermal energy is being applied, the phosphorous-implanted regions 8N and boron-implanted regions 8P are cured, and the ion-implanted phosphorous in the doped regions 8N and the ion-implanted boron in the doped regions 8P are diffused in such a manner as to form a predetermined profiles. Thus, shallow phosphorous-doped regions and shallow boron-doped source and drain regions 9P are formed on both sides of the gate structures 7N' and 7P'.

Figure 5:
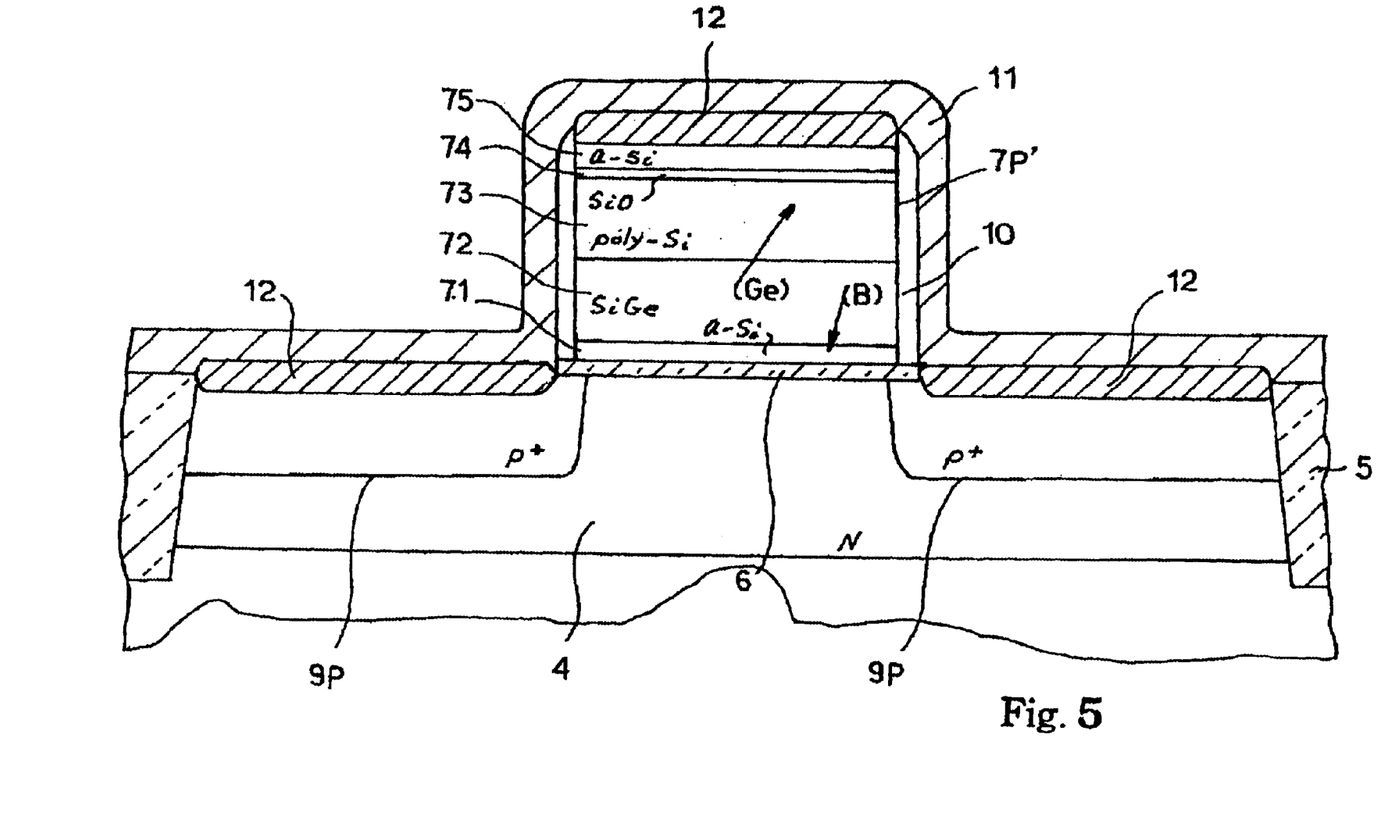
FIG. 5 is a cross sectional view showing the behavior of boron and germanium in a gate structure during a heat treatment.

While the ion-implanted dopant impurities are being activated in the doped regions 8N/8P, the thermal energy further makes the ion-implanted phosphorous and ion-implanted boron active in the gate structures 7N'/7P'. Although the ion-implanted boron is hardly activated in the gate structure 7P', the germanium promotes the activation of the ion-implanted boron. The boron (B) is diffused into the amorphous silicon strip 71 as well as the silicon-germanium strip 72, and reaches the boundary between the gate insulating layer 6 and the amorphous silicon strip 71 as shown in FIG. 5. The germanium (Ge) is also diffused into the amorphous silicon layer 71, and promotes the activation of the boron (B). This results in increase in boron concentration at the boundary.

Though not shown in the drawings, the phosphorous is also diffused in the gate structure 8N', and the germanium suppresses the activation of phosphorous. However, the silicon is rich in the silicon-germanium strip 72, i.e., the mixing ratio Si:Ge is 70–80:20–30. The germanium is not so much in the silicon-germanium strip 72 that the thermal energy can sufficiently activate the phosphorous in the gate structure 7N'. The n-channel type field effect transistor exhibits transistor characteristics close to target characteristics.

Figure 2E:
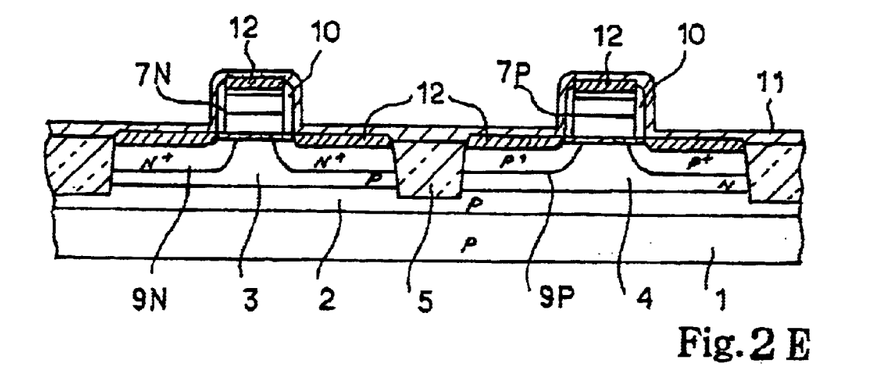

While the boron and phosphorous are being activated in the doped regions 8N/8P and gate structures 7N'/7P', the thermal energy gives rise to reaction between the silicon and cobalt. Although the reaction does not occur at the boundary between the cobalt layer 11 and the side wall insulating spacers/isolating region 10/5, the cobalt reacts with the silicon in the cap silicon strips 75 and doped regions 8N/8P, and cobalt silicide layers 12 are produced on the amorphous silicon strips 74, n-type doped regions 8N and p-type doped regions 8P in a self-aligned manner as shown in FIG. 2E.

The amorphous silicon strip 75 is consumed in the reaction, and the cobalt silicide layer 12 is of the order of 20 nanometers to 50 nanometers thick.

Although the germanium (Ge) is diffused through the polysilicon strips 73 of the gate structures 7N'/7P' (see FIG. 5), the barrier strips 74 do not permit the germanium to pass therethrough, and prevent the boundary between the cap silicon strips 75 and the cobalt layer 11 from the germanium (Ge). Thus, the germanium does not reach the boundary between the cap silicon layer 75 and the cobalt layer 11 so that the cobalt smoothly reacts with the silicon. This means that the cobalt silicide is never coagulated on the cap silicon layer 75.

Figure 4:
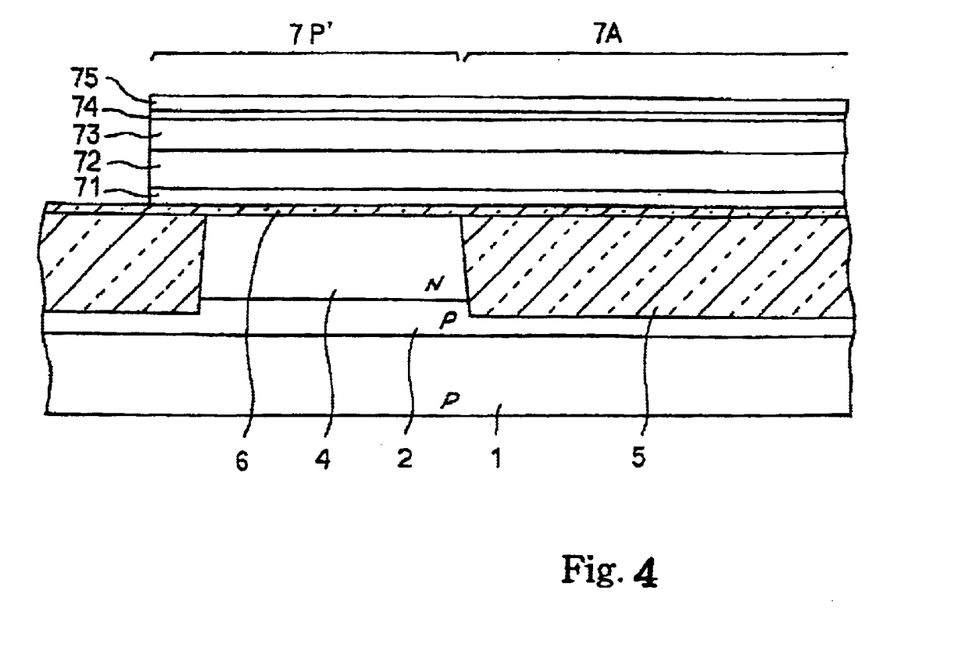
FIG. 4 is a cross sectional view showing the structure of gate electrode and gate signal line incorporated in a p-channel type field effect transistor incorporated in the semiconductor device.

The gate structures 7N'/7P' and extensions 7A are overlaid with the cobalt silicide layers 12 as shown in FIG. 4, and the gate structures 7N'/7P' and cobalt silicide layers 12 as a whole constitute gate electrodes 7N/7P. However, the cobalt is still left on the side wall insulating spacers 10 and isolating region 5. The phosphorous-doped regions 8N and cobalt silicide layers thereon form in combination n-type shallow source and drain regions 9N, and the boron-doped regions 8P and cobalt silicide layers thereon form in combination p-type shallow source and drain regions 9P.

Subsequently, the residual cobalt 11 is etched away, and insulating material is deposited over the entire surface of the resultant semiconductor structure. The insulting material forms an inter-layered insulating layer 13. A photo-resist etching mask (not shown) is formed on the inter-layered insulating layer 13, and the inter-layered insulating layer 13 is selectively etched so as to form contact holes 15 in the inter-layered insulating layer 13. The cobalt silicide layer 12 of the n-type shallow source region 9N, cobalt silicide layer 12. of the p-type shallow source region 9P and the cobalt silicide layers of the gate signal lines 7A are exposed to the contact holes 15, respectively.

Conductive material is deposited over the entire surface of the resultant semiconductor structure. The conductive material fills the contact holes, and swells into a conductive layer. A photo-resist mask (not shown) is formed on the conductive layer, and the conductive layer is selectively etched so as to leave conductive lines 14 on the inter-layered insulating layer 13 as shown in FIG. 2F.

Figure 2F:
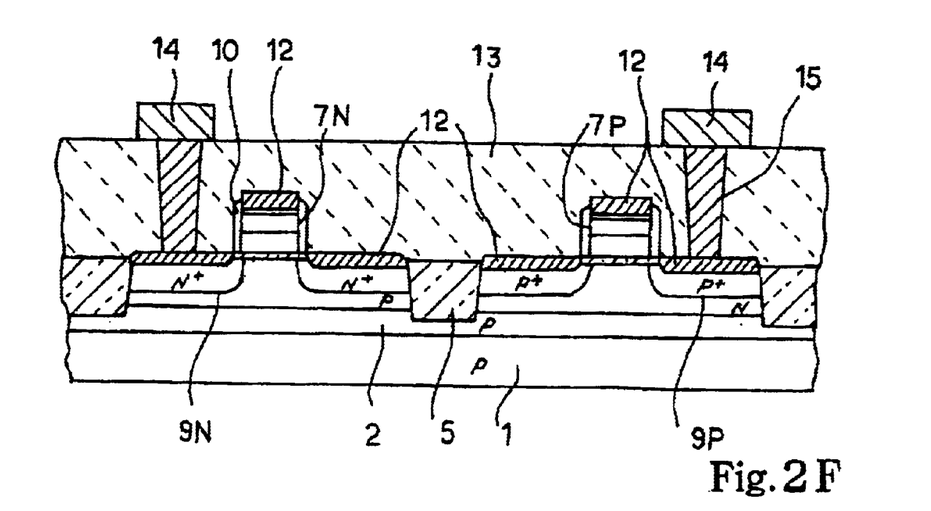

In the integrated circuit shown in FIG. 2F, the p-type shallow source and drain regions 9P, gate insulating layer 6 between the p-type shallow source and drain regions and gate electrode 7P on the gate insulating layer 6 as a whole constitute the p-channel type field effect transistor. The silicon strip 71 and silicon-germanium layer as a whole constitute a germanium-containing conductive layer, and the polysilicon strip 73, barrier layer 75 and cap silicon layer 75 form in combination a silicon-containing conductive layer.

As will be understood from the foregoing description, the germanium promotes the activation of the p-type dopant impurity without undesirable influence on the reaction between the silicon and the cobalt by virtue of the barrier layer. The refractory metal silicide layer smoothly extends on the silicon-containing conductive layer without coagulation of the refractory metal silicide.

In case where the semiconductor device is implemented by p-channel field effect transistors and other circuit components such as signal lines, the introduction of n-type dopant impurity (see FIG. 2B) is omitted from the fabrication process, and the process sequence is simpler than that described hereinbefore.

Evaluation

The present inventor fabricated samples of the p-channel type field effect transistor, and evaluated the p-channel type field effect transistor as follows.

Figure 6A:
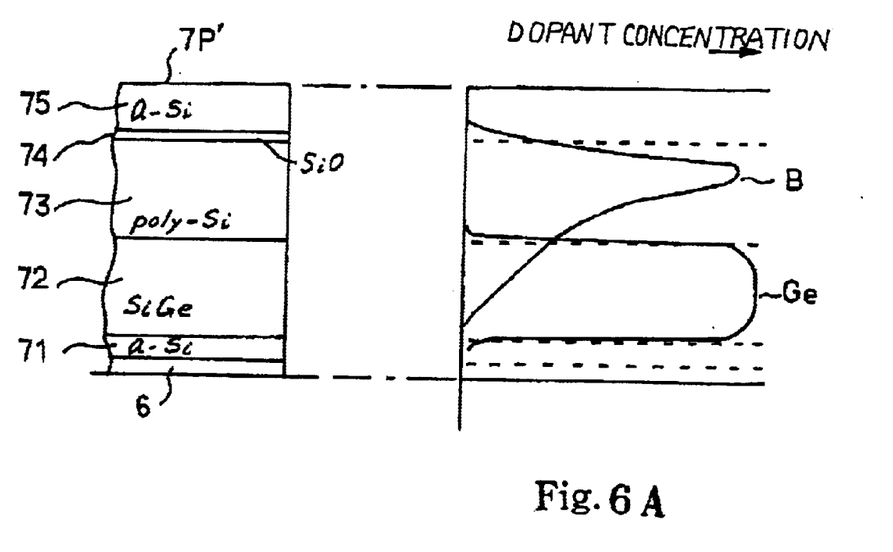
FIG. 6A is a graph showing a boron profile and a germanium profile in a gate structure before a heat treatment.

The present inventor investigated the profile of boron and profile of germanium before and after the heat treatment. FIG. 6A shows the dopant concentration of the boron and the dopant concentration of the germanium in the gate structure 7P'. The boron concentration was peaked in the polysilicon strip 73, and was decreased to zero in the cap silicon strip 75 and the silicon-germanium strip 72. The boron concentration was zero in the amorphous silicon strip 71. On the other hand, the germanium concentration was almost constant over the thickness of the silicon-germanium strip 72, and germanium slightly penetrated into the boundaries of the silicon-germanium strip 72.

Figure 6B:
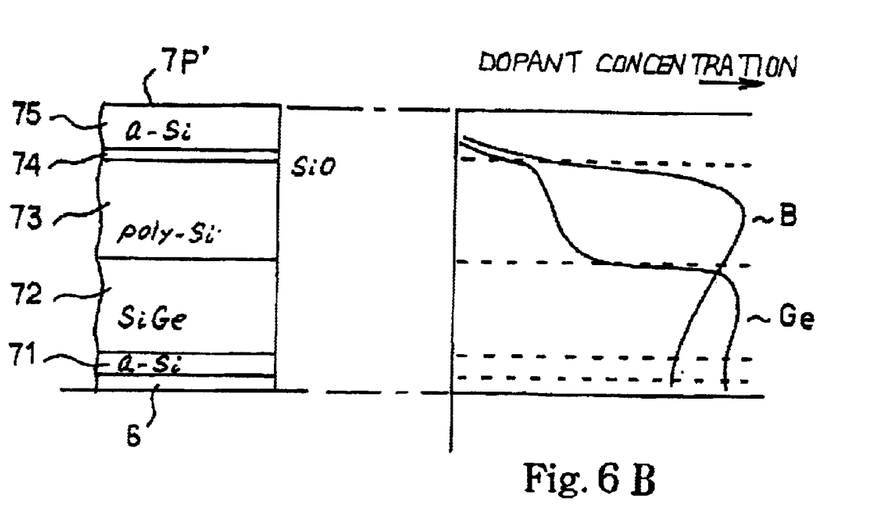
FIG. 6B is a graph showing the boron profile and the germanium profile in a gate structure after the heat treatment.

While the gate structure 7P' was being heated, the boron and germanium were diffused, and the boron concentration and germanium concentration were varied as shown in FIG. 6B. A large amount of the germanium was diffused into the amorphous silicon strip 71, and the germanium concentration in the amorphous silicon strip 71 was almost as heavy as the silicon-germanium strip 72. Although the germanium was diffused into the polysilicon strip 73, the barrier strip 74 blocked the cap silicon strip 75 from the germanium, and the germanium concentration was negligible in the cap silicon strip 75. The boron was diffused through the silicon-germanium strip 72 into the amorphous silicon strip 71, and was activated in the presence of the germanium. Thus, the boron concentration was drastically increased in the amorphous silicon strip 71. The barrier strip 74 was also obstacle against the diffusion of the boron, and the boron concentration was low in the cap silicon strip 75. The present inventor confirmed that the barrier strip 74 was effective against the diffusion of germanium without any undesirable influence on the activation of the boron at the boundary between the amorphous silicon strip 71 and the gate insulating layer 6.

Figure 7:
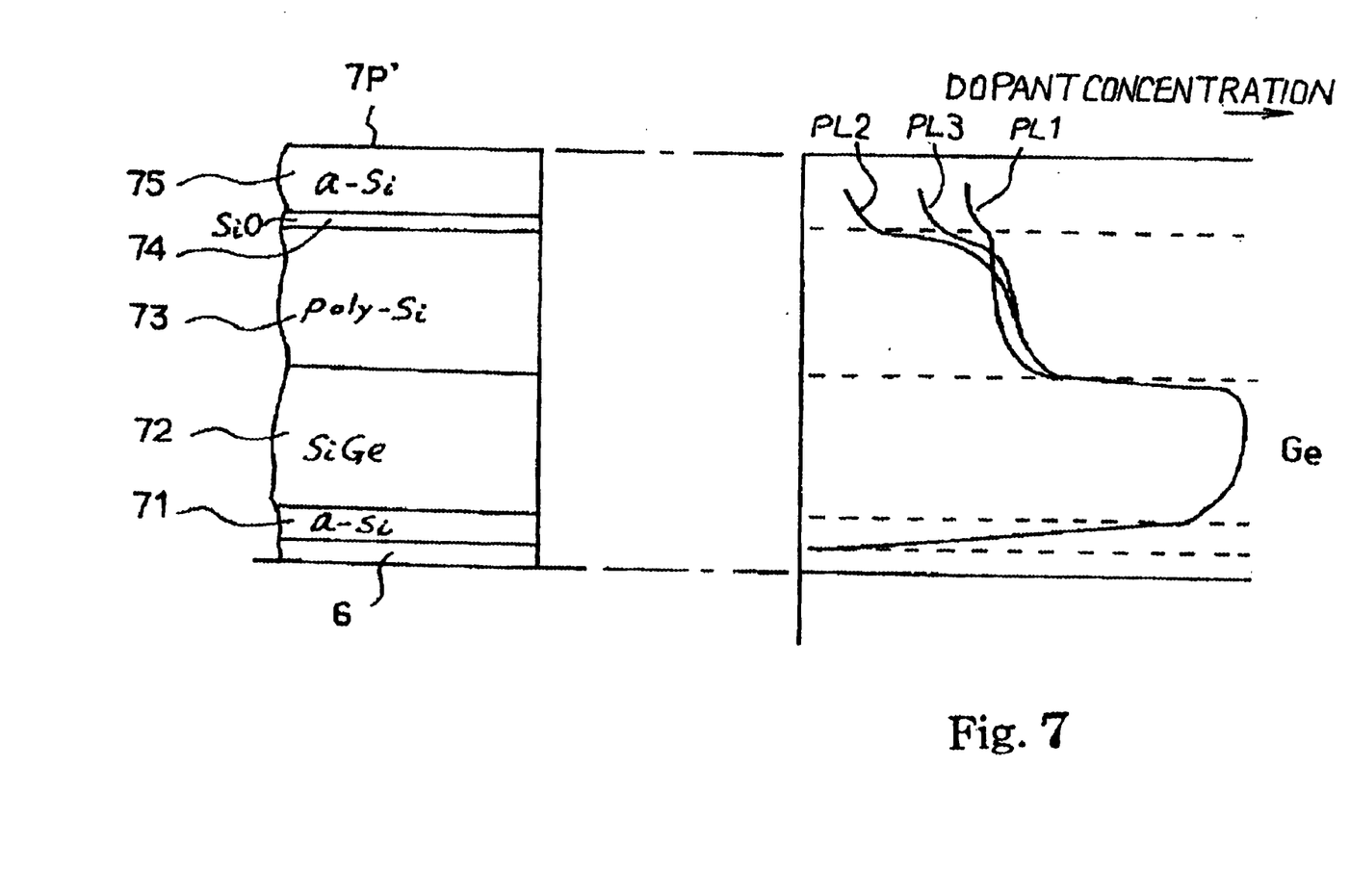
FIG. 7 is a graph showing the germanium concentration after the heat treatment in sample with barrier strips grown in different ambiences.

Subsequently, the present inventor investigated the oxidizing techniques. The present inventor prepared samples, in which the barrier strips 74 were grown through the three sorts of oxidation techniques. The barrier strip 74 of the first sample was grown through the natural oxidation in the atmosphere. The barrier strip 74 of the second sample was grown through the oxidation in the gas containing the oxygen in the deposition chamber, and the barrier strip 74 of the third sample was grown through the oxidation in the cleaning solution. The oxidizing conditions were regulated in such a manner that the carrier strip 74 of the third sample was thicker than the barrier strip 74 of the first sample and thinner than the barrier strip 74 of the second sample.

The present inventor heated the first, second and third samples, and determined the germanium concentration in the gate structure 7P'. The germanium concentration in the first sample was plotted as PL1. Plots PL2 and PL3 were indicative of the germanium concentration in the second sample and the germanium concentration of the third sample, respectively. The barrier strip 74 in the second sample merely permitted a negligible amount of germanium to enter the cap silicon strip 75. However, a relatively large amount of germanium was diffused through the barrier strip 74 of the first sample. Thus, the thicker the barrier strip 74, the more the germanium concentration in the cap silicon layer 75.

The present inventor investigated the diffusion of boron through the polysilicon layer. As described hereinbefore, the amorphous silicon strip 71 and cap silicon layer are made of amorphous silicon or polysilicon, and the polysilicon strip 73 is replaceable with an amorphous silicon strip. In case where the amorphous silicon is used, the amorphous silicon is crystallized in the heat treatment. However, the grain size is of the order of 100 nanometers.

In order to investigate the diffusion property, the present inventor prepared the first sample which had the polysilicon strip 73 and the second sample which had an amorphous silicon strip instead of the polysilicon strip 73. The polysilicon strip 73 had the grain size between 20 nanometers and 50 nanometers. On the other hand, the amorphous silicon was cristallized in the heat treatment, and the grain size was of the order of 100 nanometers.

Figure 8A:
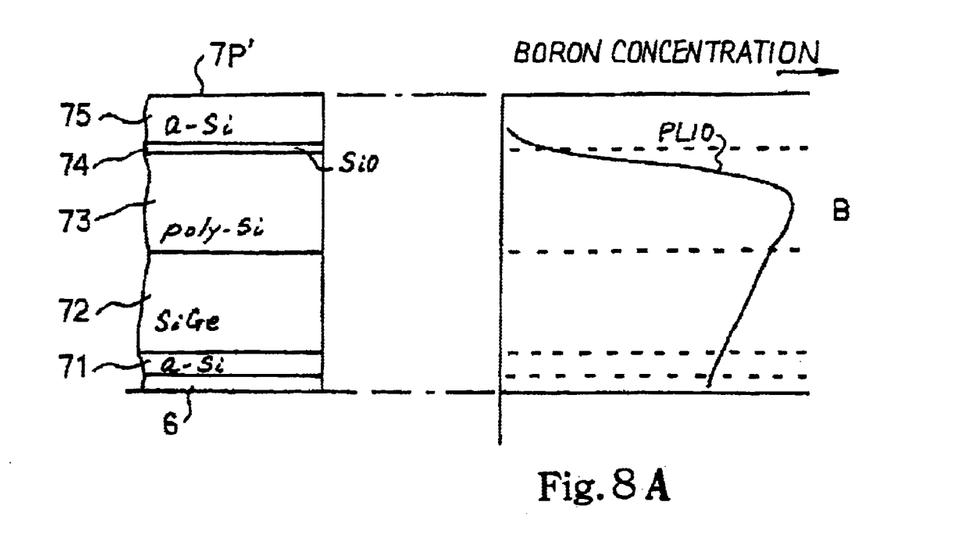
FIG. 8A is a graph showing the boron concentration in a polysilicon strip after the heat treatment.
Figure 8B:
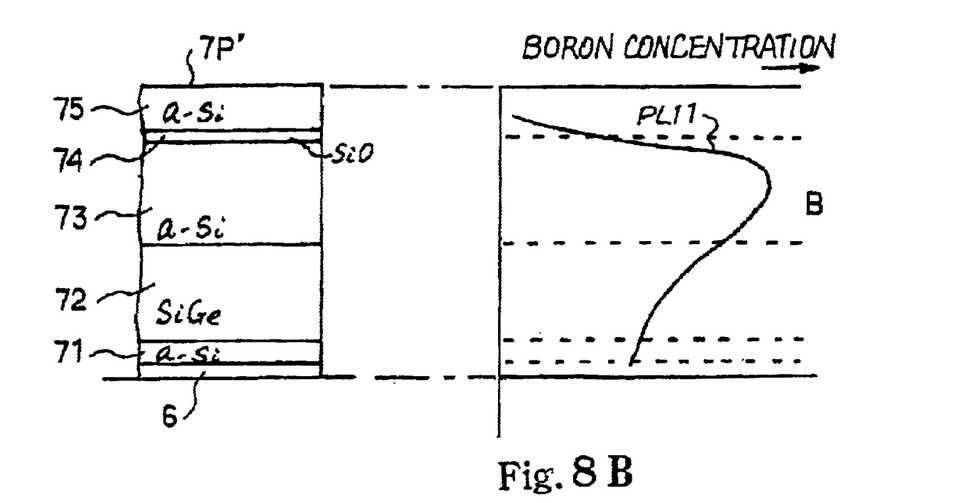
FIG. 8B is a graph showing the boron concentration in a crystallized silicon strip after the heat treatment.

After the heat treatment, the present inventor determined the boron profile in the gate structures 7P' of the first and second samples. The present inventor plotted the boron concentration in the gate structure 7P' of the first sample and the boron concentration in the gate structure 7P' of the second sample in FIGS. 8A and 8B. Plots PL10 and PL11 were indicative of the boron concentration in the first sample and the boron concentration in the second sample. Comparing plots PL10 with plots PL11, it was understood that the boron was diffused at a high speed in the polysilicon. The present inventor concluded that the polysilicon, which had the grain size between 20 nanometers and 50 nanometers, was preferable for the silicon strip 73 beneath the barrier layer 74.

Figure 9:
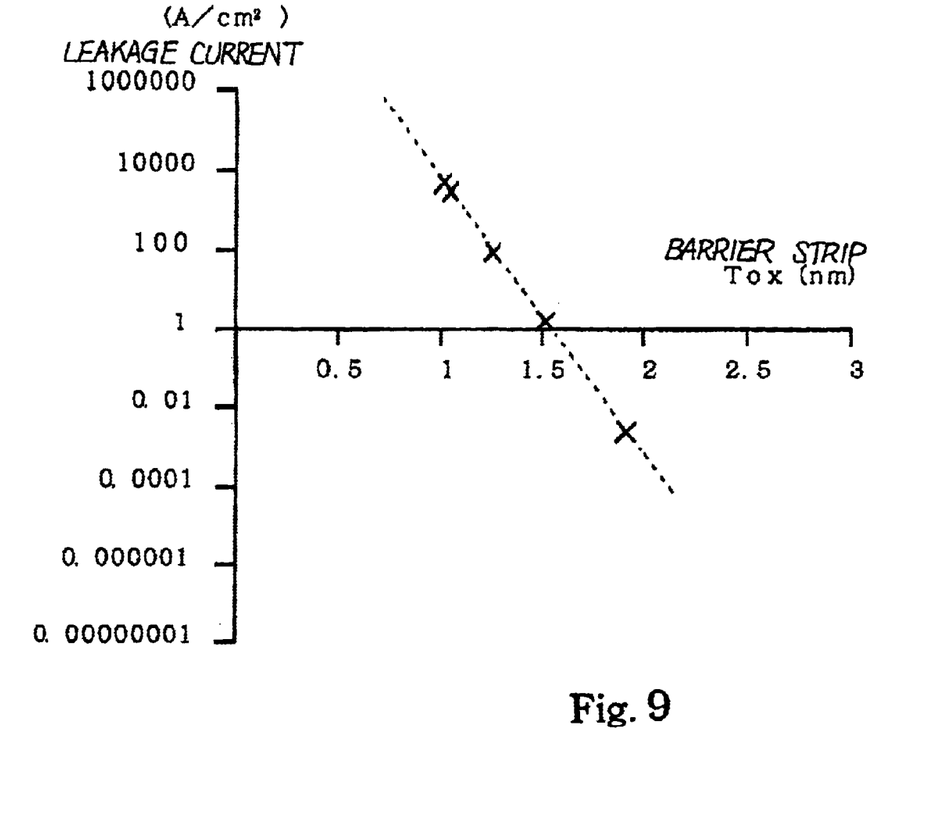
FIG. 9 is a graph showing relation between the thickness of a barrier strip and the amount of leakage current.

Finally, the present inventor investigated the current blocking property of the barrier layer 74. In case where the barrier layer 74 is made of silicon oxide, the barrier layer 74 is to be 0.5 nanometer thick to 1.5 nanometers thick. If the silicon oxide barrier layer is greater in thickness than the preferable range, the cobalt silicide layer 12, barrier strip 74 and the polysilicon strip 73 form a capacitor coupled in series to the gate electrode 7P, and the capacitor degraded the signal propagation property along the gate signal line.

The present inventor prepared samples, the barrier strips 74 of which were different in thickness. The present inventor measured leakage current flowing through the barrier strips 74, and plotted the amount of leakage current in FIG. 9. The leakage current flew through the barrier layer at 1.5 nanometers thick. The amount of current was increased as the barrier strip 74 was decreased in thickness. The barrier strip thicker than 1.5 nanometers did not permit the current to flow. In other words, in case where the barrier strip 74 was greater than 1.5 nanometers thick, the barrier strip 74 electrically isolated the cobalt silicide layer 12 from the polysilicon strip 73. Even though the depletion layer was restricted at the boundary between the gate insulating layer 6 and the amorphous silicon strip 71, the capacitor frustrated the design to introduce the germanium. Although a thick barrier strip 74 was effective against the diffusion of the germanium (see FIG. 7), the current hardly flew through the thick barrier strip 74. The present inventor compromised the trade-off, and determined the thickness of the barrier strip 74.

As will be appreciated from the foregoing description, the barrier strip 74 blocks the boundary between the silicon strip 75 and the cobalt layer 11 from the germanium during the heat treatment. The cobalt smoothly reacts with the silicon, and the cobalt silicide forms a continuous layer. Nevertheless, the germanium is diffused to the boundary between the gate insulating layer 6 and the silicon layer 71, and promotes the activation of the p-type dopant impurity. The dopant concentration at the boundary is so heavy that the depletion layer is restricted.

Modifications

Although a particular embodiment of the present invention has been shown and described, it will be apparent to those skilled in the art that various changes and modifications may be made without departing from the spirit and scope of the present invention.

For example, any sort of oxidizing/nitriding ambience is available for the barrier layer in so far as the resultant barrier layer is extremely thin.

The activation of dopant impurities and silicidation of cobalt is achieved through only one heat treatment in the process described hereinbefore. However, the activation of dopant impurities and the silicidation of cobalt may be separately carried out. In this instance, the dopant impurities, i.e., the n-type dopant impurity and p-type dopant impurity may be activated through a heat treatment after the formation of side wall spacers. If so, the deposition of cobalt follows the heat treatment, and the cobalt layer is selectively covered to the cobalt silicide through another heat treatment.

The barrier layer may be made of silicon nitride, i.e., SiN or titanium nitride TiN. The silicon nitride is electrically insulating, and is to be as thin as the silicon oxide, i.e., 0.5 nanometer thick to 1.5 nanometers thick. However, the titanium nitride has the conductivity so that the barrier strip of titanium nitride is to range between 5 nanometers thick to 15 nanometers thick.

In case where the silicon nitride is grown through a heat treatment in ammonia atmosphere. Otherwise, the silicon nitride is grown through a plasma processing in nitrogen atmosphere. On the other hand, the titanium nitride is deposited by using a chemical vapor deposition or sputtering.

The refractory metal may be titanium or nickel. The present inventor confirmed that the barrier layer 74 prevented the silicidation of titanium or nickel from the germanium.

In case where the p-channel type field effect transistors are integrated without the n-channel type field effect transistor, it is not necessary to take the influence of the germanium on the gate structure 7N' of the n-channel type field effect transistor into account. This means that the germanium content of the silicon-germanium layer is increaseable. The increased germanium content enhances the activation of p-type dopant impurity.

What is claimed is:

1. A semiconductor device having a field effect transistor, said field effect transistor comprising
    a semiconductor layer including a source region, a drain region and a channel region between said source region and said drain region,
    a gate insulating layer formed on said channel region, and
    a gate electrode formed on said gate insulating layer and including
        a germanium-containing conductive strip formed on said gate insulating layer and having a boundary region to said gate insulating layer heavily doped with a dopant impurity,
        a silicon containing conductive strip formed on said germanium-containing conductive strip, heavily doped with said dopant impurity and including a barrier strip against a diffusion of the germanium contained in said germanium-containing conductive strip and
        a refractory metal silicide layer formed on said silicon containing conductive strip.

2. The semiconductor device as set forth in claim 1, in which said dopant impurity imparts a p-type conductivity to said germanium containing conductive strip including said boundary region and said silicon containing strip.

3. The semiconductor device as set forth in claim 2, in which said germanium containing conductive strip includes a silicon layer partially serving as said boundary region and a silicon germanium layer formed on said silicon layer.

4. The semiconductor device as set forth in claim 3, in which the concentration of said germanium is fallen within the range between 10% and 30% in said silicon germanium layer.

5. The semiconductor device as set forth in claim 2, in which said silicon containing conductive strip includes a polysilicon layer formed on said germanium-containing conductive layer, said barrier layer and a residual layer of silicon.

6. The semiconductor device as set forth in claim 5, in which the polysilicon of said polysilicon layer has a grain size fallen within the range between 20 nanometers and 50 nanometers.

7. The semiconductor device as set forth in claim 5, in which said barrier layer is made of a substance selected from the group consisting of silicon oxide, silicon nitride and titanium nitride.

8. The semiconductor device as set forth in claim 7, in which said barrier layer is made of one of said silicon oxide and said silicon nitride, and has the thickness ranging between 0.5 nanometer and 1.5 nanometers.

9. The semiconductor device as set forth in claim 7, in which said barrier layer is made of said titanium nitride, and has the thickness ranging between 5 nanometers and 15 nanometers.

10. The semiconductor device as set forth in claim 1, in which said refractory metal silicide layer is made of a substance selected from the group consisting cobalt silicide, nickel silicide and titanium silicide.

11. The semiconductor device as set forth in claim 10, in which said refractory metal silicide layer has a thickness ranging between 20 nanometers and 50 nanometers.

12. The semiconductor device as set forth in claim 1, in which said field effect transistor is a p-channel type, and forms a part of an integrated circuit together with an n-channel type field effect transistor.

13. The semiconductor device as set forth in claim 12, in which the p-channel type field effect transistor and said n-channel type field effect transistor form in combination a complementary field effect transistor.

* * * * *